(12) United States Patent
Liao et al.

(10) Patent No.: US 7,943,441 B2
(45) Date of Patent: May 17, 2011

(54) METHOD OF FORMING THIN FILM TRANSISTOR ARRAY SUBSTRATE

(75) Inventors: Chan-Chang Liao, Taipei County (TW); Hsien-Kun Chiu, Taoyuan County (TW); Wei-Pang Yen, Taoyuan County (TW); Chao-Huan Hsu, Taoyuan County (TW); Kun-Yuan Huang, Taipei (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 0 days.

(21) Appl. No.: 12/581,153

(22) Filed: Oct. 18, 2009

(65) Prior Publication Data

US 2011/0014753 A1    Jan. 20, 2011

(30) Foreign Application Priority Data

Jul. 17, 2009    (TW) ................................ 98124209 A

(51) Int. Cl.
*H01L 21/84* (2006.01)
*H01L 21/00* (2006.01)

(52) U.S. Cl. ........ 438/149; 438/151; 438/155; 438/158; 438/159; 438/701; 257/E21.37; 257/E21.372; 257/E21.414

(58) Field of Classification Search ............. 257/E21.37, 257/E21.372, E21.414
See application file for complete search history.

(56) References Cited

U.S. PATENT DOCUMENTS

| 5,264,383 | A  | * | 11/1993 | Young | ........................... 438/151 |
|---|---|---|---|---|---|
| 6,537,840 | B2 |   | 3/2003 | Tseng | |
| 7,005,331 | B2 |   | 2/2006 | Chen | |
| 7,016,007 | B2 |   | 3/2006 | Chang | |
| 7,078,279 | B2 |   | 7/2006 | Yoo | |
| 7,550,327 | B2 | * | 6/2009 | Lee et al. | ...................... 438/149 |
| 2007/0155068 | A1 | * | 7/2007 | Lee et al. | ...................... 438/149 |
| 2009/0085032 | A1 | * | 4/2009 | Chiu et al. | ...................... 257/59 |
| 2009/0176325 | A1 | * | 7/2009 | Jeon et al. | ...................... 438/34 |

* cited by examiner

Primary Examiner — Charles D Garber
Assistant Examiner — Mohsen Ahmadi
(74) Attorney, Agent, or Firm — Winston Hsu; Scott Margo

(57) ABSTRACT

A method of forming a thin-film transistor array substrate is provided. A first mask is used to define a source, a drain and a channel on a substrate. A dielectric layer is formed to cover the source, the drain, the channel and the substrate. A second mask is used to define a patterned photoresist and the dielectric layer. A transparent conductive layer is formed to cover the patterned photoresist and the substrate. A lift-off process is performed to remove the patterned photoresist and a portion of the transparent conductive layer disposed on the patterned photoresist. A third mask is used to define a gate disposed on the dielectric layer.

11 Claims, 9 Drawing Sheets

METHOD OF FORMING THIN FILM TRANSISTOR ARRAY SUBSTRATE

BACKGROUND OF THE INVENTION

1. Field of the Invention

The present invention is related to a method for forming a thin-film transistor array substrate, and more particularly, to a method for forming a thin-film transistor array substrate required only three masks.

2. Description of the Prior Art

As the manufacturing technique of flat panel displays advances, it has become effortless to offer flat panel displays characterized in large size, high resolution, and high brightness. Throughout the manufacturing process, quality control is considered to be a critical factor to improve the production yield rate in addition to product dimension and quality. Generally speaking, a thin-film transistor liquid crystal display (TFT-LCD) mainly contains three processes including: thin-film transistor array engineering, cell engineering, and module engineering. Among them, thin-film transistor array engineering is achieved by forming an array-shaped thin-film transistor circuit on a glass substrate, which includes a plurality of scanning lines, signal lines, and pixel structures defined by intersected scanning lines and signal lines.

In the conventional art, a pixel structure of the thin-film transistor circuit has to be fabricated by five masks i.e. five photolithographic-and-etching processes, and each of them is provided with different patterns. As the requirement of large-sized flat panel displays grows, masks for manufacturing of large-sized flat panel displays have to be enlarged accordingly. Moreover, the cost for large-sized masks is higher and it is necessary to use different masks in each mask fabrication step. Consequently, it is hard to lower the cost for fabricating large-sized flat panel displays subjected to the quantity and cost of the masks.

SUMMARY OF THE INVENTION

It is one of the objectives of the present invention to reduce the required quantity of masks in a method for forming a thin-film transistor array substrate, thereby simplifying its process for fabricating a thin-film transistor array substrate.

In accordance with an embodiment of the present invention, a method for forming a thin-film transistor array substrate is provided. The method includes providing a substrate, the substrate containing a light-shielding layer, a semiconductor layer, and a first metallic layer sequentially stacked thereon; patterning the first metallic layer, the semiconductor layer, the light-shielding layer to form a source, a drain, and a channel disposed between the source and the drain; and forming a dielectric layer covering the substrate, the source, the drain, and the channel. Next, a patterned photoresist is formed on the dielectric layer, and the dielectric layer not covered by the patterned photoresist is removed to partially expose a surface of the drain. It is then followed by forming a transparent conductive layer covering the patterned photoresist, the partially-exposed surface of the drain, and the substrate; removing the patterned photoresist and a portion of the transparent conductive layer covering the patterned photoresist altogether; and forming a gate on the dielectric layer, wherein the gate is disposed between the source and the drain, and corresponding to the channel.

The method for manufacturing a thin-film transistor array substrate offered by the present invention requires only three masks; thus it can significantly lower the cost contributed from the masks and is applicable to fabricating panels with different sizes. These and other objectives of the present invention will no doubt become obvious to those of ordinary skill in the art after reading the following detailed description of the preferred embodiment that is illustrated in the various figures and drawings.

DETAILED DESCRIPTION

Figure 1:
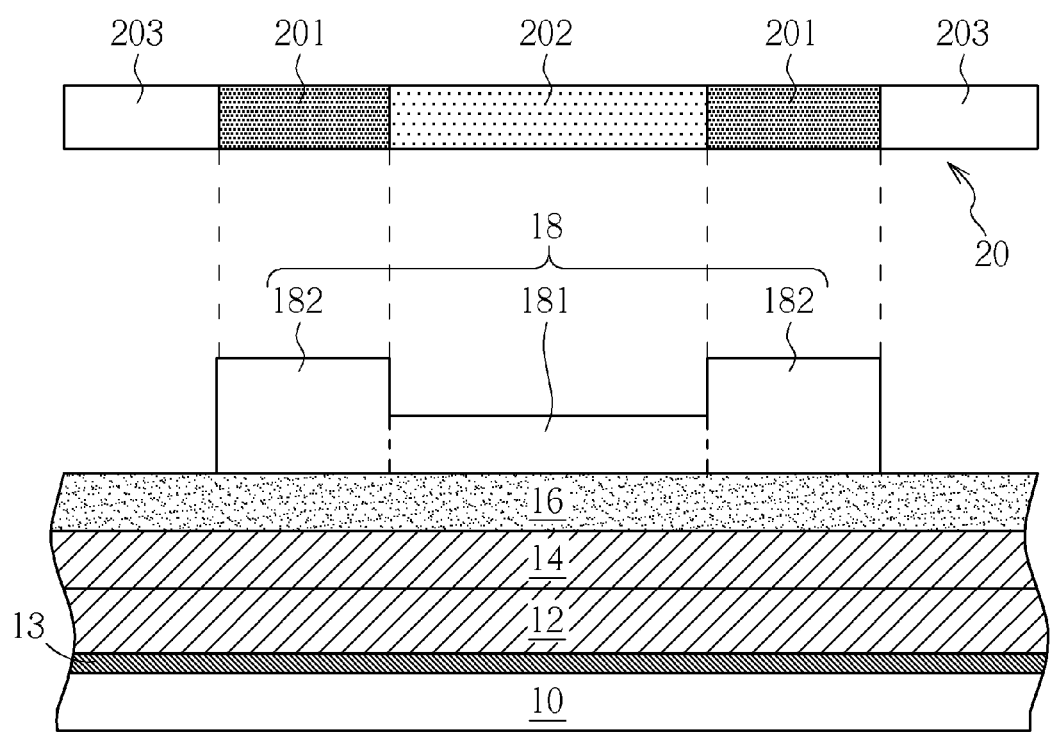
FIGS. 1 to 9 show a method for forming a thin-film transistor array substrate according to a preferred embodiment of the present invention.

Certain terms are applied throughout the following description and claims to refer to particular components. As those of ordinary skill will appreciate, manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". In addition, the term "electrically connected" includes any directly or indirectly electrical connection methods. Therefore, if the description in the following paragraphs is that a first device is electrically connected to a second device, the aforementioned words stand for that the first device can be electrically connected to the second device directly or be electrically connected to the second device indirectly by means of other devices or electrical connection methods.

FIGS. 1 to 9 show a method for forming a thin-film transistor array substrate according to a preferred embodiment of the present invention. First referring to FIG. 1, a substrate 10 is provided and its surface is sequentially stacked with a semiconductor layer 12, an ohmic contact layer 14, and a first metallic layer 16, wherein the substrate 10 can be a glass substrate, a plastic substrate, or a flexible substrate while the semiconductor layer 12 and the ohmic contact layer 14 can be made of amorphous silicon or other semiconductor materials. The ohmic contact layer 14 can also be a heavily-doped amorphous silicon layer. Further, the first metallic layer 16 can be made of different metals such as aluminum, molybdenum, titanium, chromium, or copper; nitrides of the above-mentioned metals such as titanium nitrides; or alloys made of the metals described above or other semiconductor materials. Moreover, the semiconductor layer 12 and the substrate 10 can selectively be formed with a light-shielding layer 13, and the light-shielding layer 13 can be selected from metals or resins with light-shielding effects to lower its leakage probability when the semiconductor layer 12 is radiated by the backlight.

Additionally, as indicated in FIG. 1, a photoresist layer (not shown in the drawings) is provided after the first metallic layer 16 is formed as well as a first photolithographic step is performed by using a half-tone mask 20 or a gray-tone mask. Then a first patterned mask 18 is formed on the first metallic layer 16 by patterning the photoresist layer, wherein the half-tone mask 20 contains a light-shielding pattern 201, a half-tone region 202, and a transparent region 203. The light-shielding pattern 201 is to define the locations of a thin-film transistor, a drain, and a source, and the half-tone region 202 is to define a channel below the source and the drain. Next, the half-tone mask 20 is used as a first mask to perform a photolithographic process, wherein a thickness of the first patterned mask 18 formed by the photolithographic process will vary as the degree of exposure varies in different portions, which is resulted from different light transmittance in different portions of the half-tone mask 20. Therefore, a first portion 181 and a second portion 182 disposed on two sides of the first portion 181 will be defined accordingly, wherein a thickness of the second portion 182 is greater than that of the first portion 181.

Figure 2:
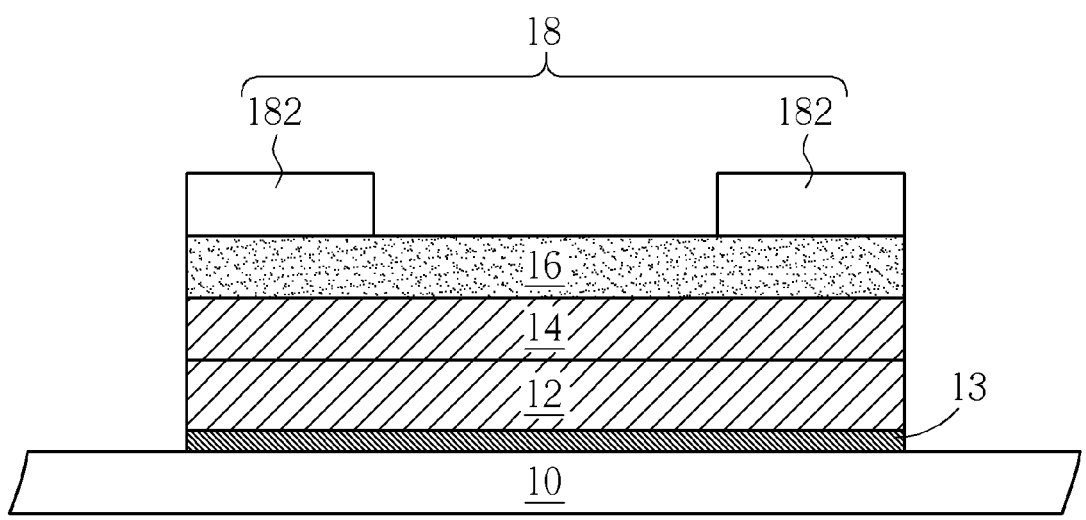
Figure 3:
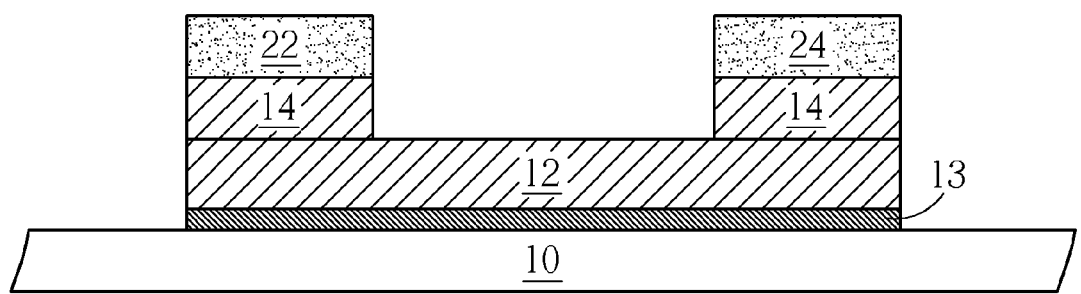

In FIG. 2, a first etching process is illustrated. The patterned mask 18 serves as an etching mask to remove the portions of the first metallic layer 16, the ohmic contact layer 14, and the semiconductor layer 12 not covered by the patterned mask 18. Then an ashing process is conducted by introducing oxygen to reduce the thickness of the patterned mask 18 until the first portion 181 of the patterned mask is completely removed. It is followed by performing a second etching process on the leftover second portion 182 to remove a portion of the first metallic layer 16 not cover by the second portion and to form a source 22 and a drain 24 of the thin-film transistor; further, a channel of the thin-film transistor is formed by the semiconductor layer 12 disposed between the source 22 and the drain 24. Later, the second portion 182 is removed entirely. As shown in FIG. 3, the methods for removing a second portion 182 may include the aforesaid ashing process, a dry etching process, and a wet etching process.

Figure 4:
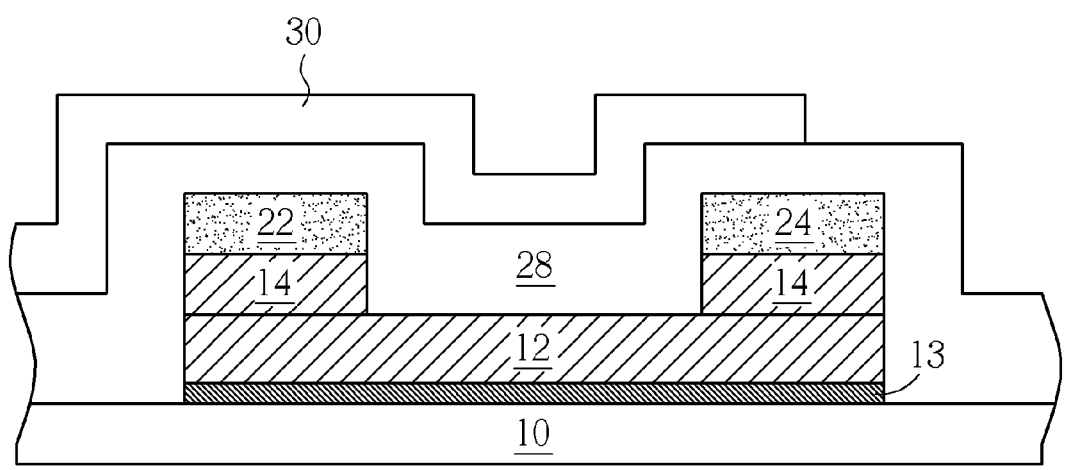

Referring to FIG. 4, a dielectric layer 28 that covers the substrate 10, the source 22, the drain 24, and the channel is formed. In the present preferred embodiment, the dielectric layer 28 may be a silicon nitride layer, a silicon oxide layer, or a silicon oxynitride and formed by means of chemical vapor deposition (CVD) or other thin film deposition techniques. Another photoresist layer is then formed on the dielectric layer 28 (not shown in the drawings), and a second mask fabrication step is performed by further providing a second mask to pattern the photoresist layer for forming a patterned photoresist 30.

Figure 5:
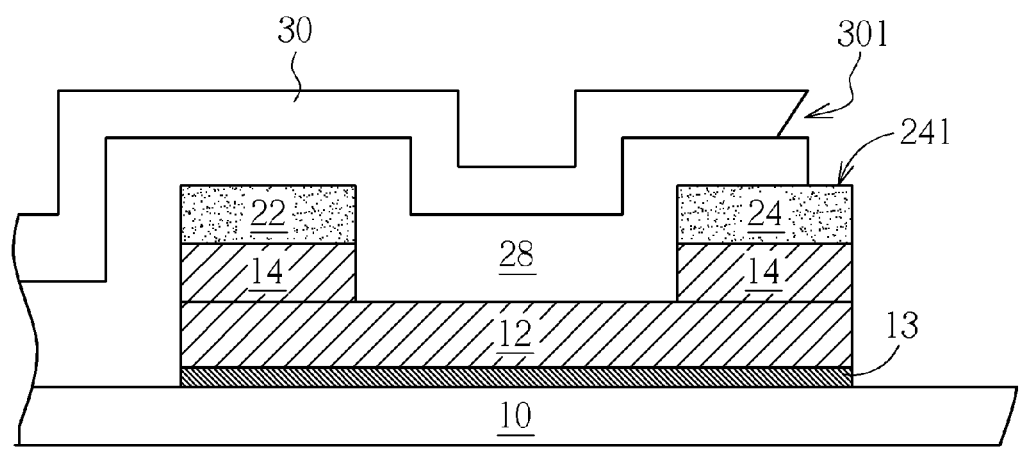

As shown in FIG. 5, the patterned photoresist 30 serves as an etching mask to perform a third etching process to remove the dielectric layer 28 not covered by the patterned photoresist 30 and to expose a partially-exposed surface 241 of the drain 24. It is followed by a post-treatment on the patterned photoresist 30 partially to form an undercut structure 301 on sidewalls of the patterned photoresist 30 so that the surface of the dielectric layer 28 can be exposed partially. The post-treatment for forming the undercut structure 301 may include an ashing process, an isotropic etching process, or a plasma manufacturing process to remove the patterned photoresist 30 partially for forming the undercut structure 301.

Figure 6:
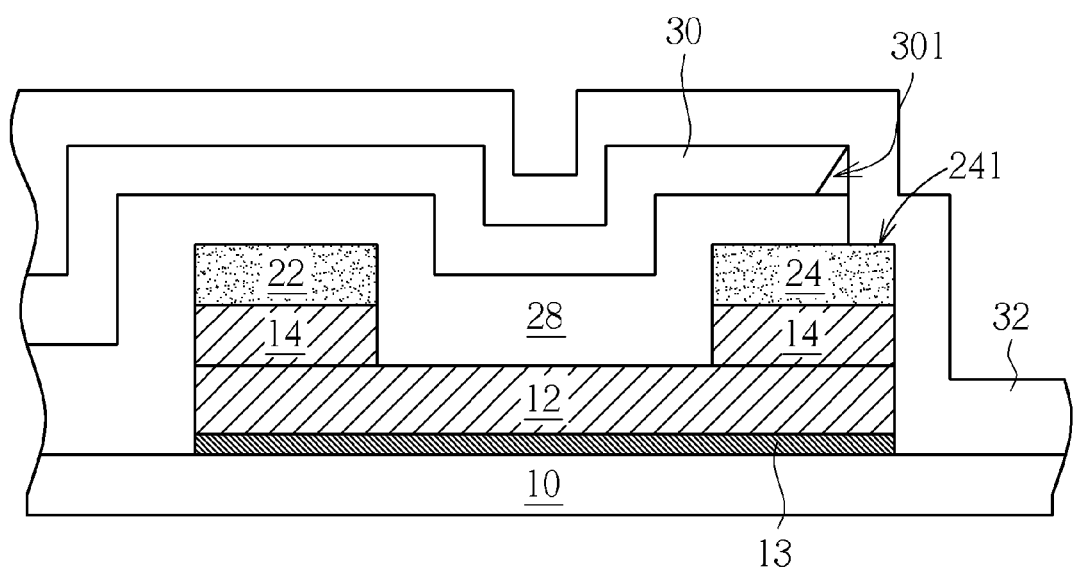

As shown in FIG. 6, a transparent conductive layer 32, which covers the patterned photoresist 30 and the substrate 10, is formed by means of a sputtering process. The transparent conductive layer 32 is in contact with the partially-exposed surface 241 of the drain 24. Additionally, the transparent conductive layer 32 extends from a surface of the patterned photoresist 30 to the partially-exposed surface 241 of the drain 24, and further to the surface of the substrate 10. Preferably, the transparent conductive layer 32 is an indium tin oxides (ITO) layer, an indium zinc oxides (IZO) layer, or layer made of other transparent and conductive materials.

Figure 7:
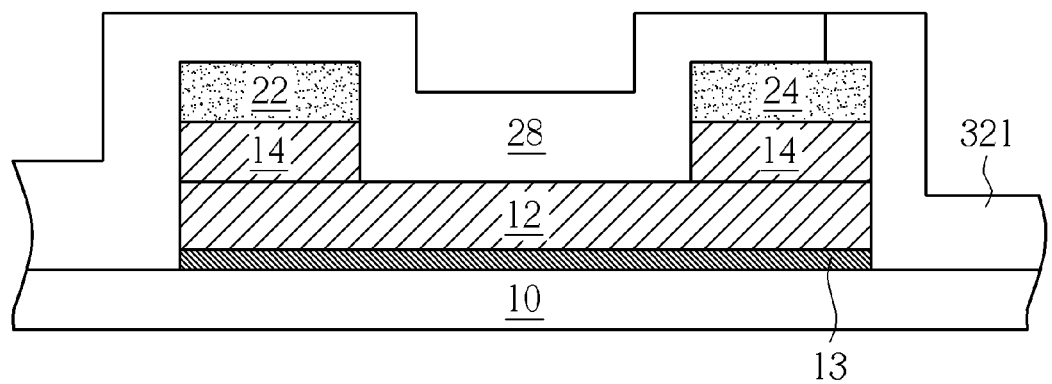

As shown in FIG. 7, a lift-off process is carried out. By the process, the patterned photoresist 30 is removed from the surface of the dielectric layer 28 and a part of the transparent conductive layer 32 covering the patterned photoresist 30 is removed as well to retain the partially-exposed surface 241 of the drain 24 and a part of the transparent conductive layer 321 on the substrate 10 and to expose the dielectric layer 28. The lift-off process described in the present embodiment can be a dry etching process, a wet etching process, an ashing process, or other methods being able to remove the photoresist without damaging the components or structure.

Figure 8:
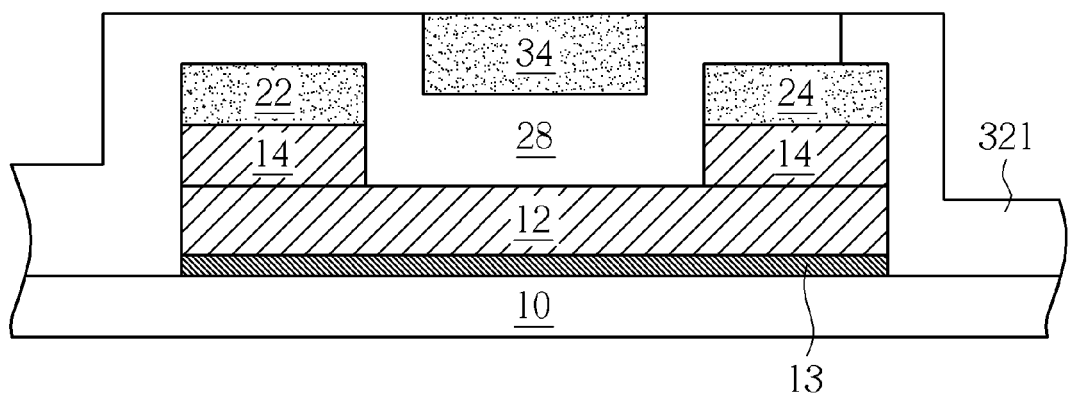
Figure 9:
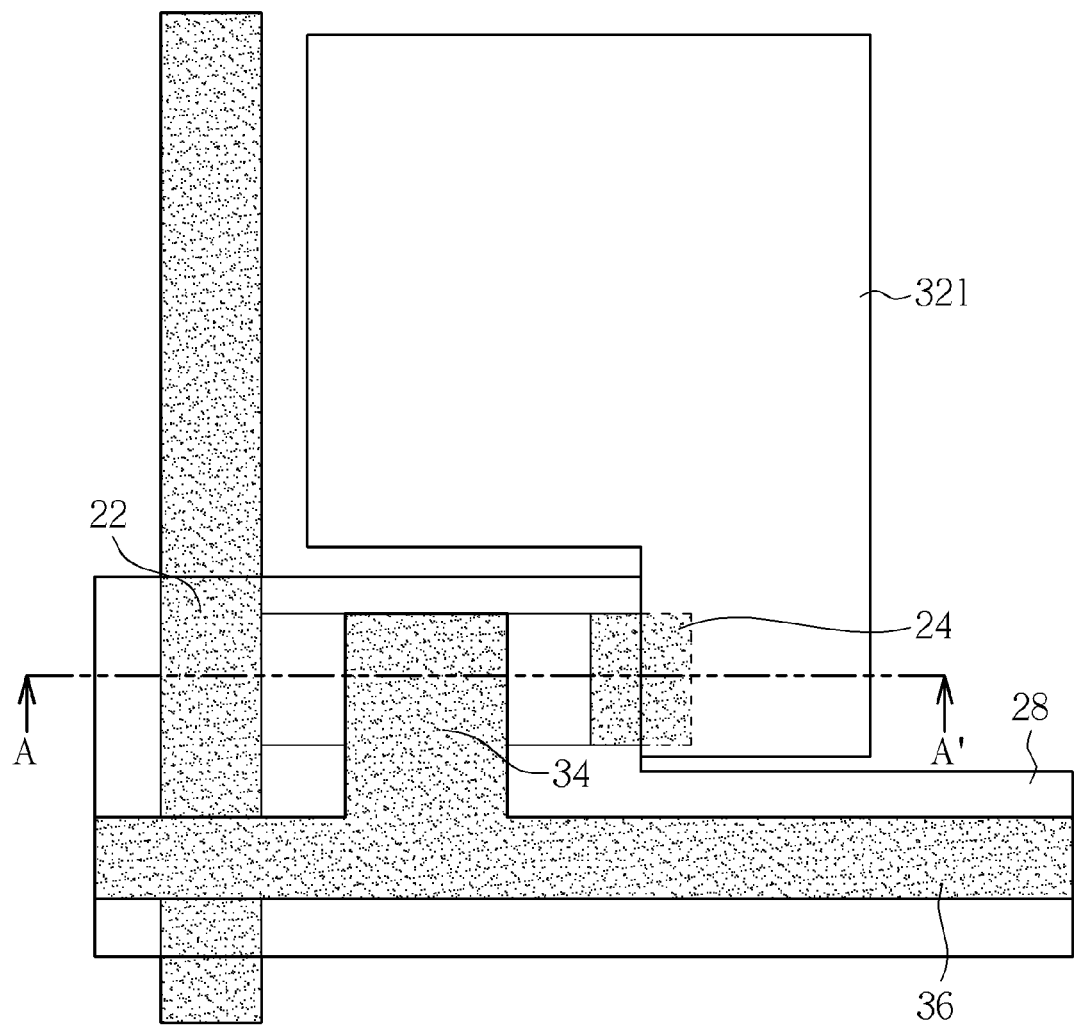

FIG. 8 is a cross-sectional schematic diagram across A to A' of FIG. 9. A second metallic layer (not shown) is formed to cover the substrate 10 and the dielectric layer 28, followed by a third mask fabrication step for patterning the second metallic layer by a third mask (not shown). As shown in FIG. 8, a gate 34 is formed along with a data line 36 connected thereto on the dielectric layer 28 as shown in FIG. 8, wherein the gate 34 is located above the channel and between the source 22 and the drain 24. At this point, the entire process for forming the TFT is finished. The gate 34 may be made of metals such as aluminum, molybdenum, titanium, chromium, or copper, alloys composed of the abovementioned metals; or other conductive materials with a good anti-corrosive ability.

To sum up, a method for forming a thin-film transistor array substrate disclosed in the present invention only requires three steps of mask fabrication, wherein the first mask defines the pattern and structure of a source and a drain, the second mask defines the pattern of a dielectric layer and a patterned photoresist, and the third mask defines the location and structure of a gate. Hence, the present invention is able to simplify the conventional five steps of mask fabrication, but also reduce its manufacturing cost. Moreover, the simplified process will result in less time consumed in photoresist-coating, soft bake, hard bake, exposure, developing, etching, and photoresist removal as well as defect probability occurred in the mask fabrication steps to improve its product yield rate. Those skilled in the art will readily observe that numerous modifications and alterations of the device and method may be made while retaining the teachings of the invention.

What is claimed is:

1. A method for forming a thin-film transistor array substrate, comprising:

providing a substrate comprising a light-shielding layer, a semiconductor layer, and a first metallic layer sequentially stacked thereon;

patterning the first metallic layer, the semiconductor layer and the light-shielding layer to form a source, a drain, and a channel disposed between the source and the drain;

forming a dielectric layer covering the substrate, the source, the drain, and the channel;

forming a patterned photoresist on the dielectric layer;

removing the dielectric layer not covered by the patterned photoresist to partially expose a surface of the drain;

forming a transparent conductive layer covering the patterned photoresist, the partially-exposed surface of the drain, and the substrate;

removing the patterned photoresist and a portion of the transparent conductive layer covering the patterned photoresist altogether; and forming a gate on the dielectric layer subsequent to removing the patterned photoresist and the portion of the transparent conductive layer covering the patterned photoresist altogether, wherein the gate is disposed between the source and the drain, and corresponding to the channel.

2. The method of claim 1, wherein forming the source, the drain, and the channel comprises:

forming a patterned mask covering the first metallic layer, the patterned mask comprising a first portion and a second portion disposed on two sides of the first portion, wherein a thickness of the second portion is greater than that of the first portion;

removing the first metallic layer and the semiconductor layer not covered by the first portion and the second portion of the patterned mask;

conducting an ashing process to remove the first portion of the patterned mask; and removing the first metallic layer not covered by the second portion of the patterned mask to define the source, the drain, and the channel.

3. The method of claim 2, wherein the patterned mask is defined by a half-tone mask.

4. The method of claim 2, wherein the patterned mask is defined by a gray-tone mask.

5. The method of claim 1, wherein the patterned photoresist comprises an undercut structure.

6. The method of claim 5, wherein removing the patterned photoresist comprises a lift-off process.

7. The method of claim 1, wherein the semiconductor layer comprises an amorphous silicon layer.

8. The method of claim 7, wherein the semiconductor layer further comprises an ohmic contact layer.

9. The method of claim 8, wherein the ohmic contact layer comprises a heavily-doped amorphous silicon layer.

10. The method of claim 1, wherein the transparent conductive layer continuously extends from a surface of the patterned photoresist to the partially-exposed surface of the drain.

11. The method of claim 1, wherein the transparent conductive layer is in contact with the drain.

* * * * *